(12) United States Patent
Meynants et al.

(10) Patent No.: US 7,777,662 B2
(45) Date of Patent: Aug. 17, 2010

(54) ANALOGUE-TO-DIGITAL CONVERTER AND METHOD FOR USING THE SAME

(75) Inventors: Guy Meynants, Retie (BE); Juan Santana, Nuenen (NL); Richard van den Hoven, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 12/256,994

(22) Filed: Oct. 23, 2008

(65) Prior Publication Data

US 2009/0128386 A1 May 21, 2009

Related U.S. Application Data

(60) Provisional application No. 61/000,721, filed on Oct. 25, 2007.

(30) Foreign Application Priority Data

Oct. 25, 2007 (EP) .................. 07119301

(51) Int. Cl.
*H03M 1/34* (2006.01)
(52) U.S. Cl. ................. 341/163; 341/155; 341/156; 341/161
(58) Field of Classification Search ................. 341/155, 341/156, 161, 163, 150, 172
See application file for complete search history.

(56) References Cited

U.S. PATENT DOCUMENTS

| | | | | |
|---|---|---|---|---|
| 4,200,863 | A * | 4/1980 | Hodges et al. | 341/156 |
| 5,640,162 | A | 6/1997 | Lewyn | |
| 6,154,162 | A | 11/2000 | Watson | |
| 6,549,155 | B1 | 4/2003 | Heminger et al. | |
| 6,600,437 | B1 * | 7/2003 | Confalonieri et al. | 341/150 |
| 6,686,865 | B2 * | 2/2004 | Confalonieri et al. | 341/172 |
| 6,844,840 | B1 * | 1/2005 | Melanson | 341/161 |
| 7,173,557 | B2 * | 2/2007 | Kuttner | 341/163 |
| 7,265,708 | B2 * | 9/2007 | Mitra et al. | 341/172 |
| 2003/0052809 | A1 * | 3/2003 | Kuttner | 341/162 |
| 2003/0123646 | A1 * | 7/2003 | Srinivasan et al. | 379/399.01 |
| 2003/0197636 | A1 * | 10/2003 | Confalonieri et al. | 341/172 |
| 2004/0246160 | A1 * | 12/2004 | Leung et al. | 341/172 |

(Continued)

OTHER PUBLICATIONS

European Search Report in Application No. 119301.5 (May 25, 2008).

(Continued)

*Primary Examiner*—Jean B Jeanglaude
(74) *Attorney, Agent, or Firm*—McDonnell Boehnen Hulbert & Berghoff LLP

(57) ABSTRACT

An analogue-to-digital (A/D) converter converts an analogue input signal to a digital code representing the analogue input signal. The A/D converter includes a comparator for comparing the input signal with a reference signal, a search logic block for determining the digital code, and an A/D converter arranged for receiving input from the search logic block and for providing the reference signal to be applied to the comparator. At least a first portion of the A/D converter is implemented with equal capacitors and may be controlled by a thermometer coded signal. Additionally, the A/D converter may include a second portion implemented using binary weighted capacitors controlled by a thermometer coded or binary coded signal. The A/D converter may also include a plurality of A/D converters coupled by an analogue addition circuit or a weighted summing amplifier.

9 Claims, 2 Drawing Sheets

U.S. PATENT DOCUMENTS

2005/0057387 A1* 3/2005 Janakiraman et al. ....... 341/156
2006/0187106 A1* 8/2006 Mitra et al. ................. 341/155

OTHER PUBLICATIONS

Nicollini, G. et al., "A High-Performance Analog Front-End 13-Bits Linear Codec for 3V Digital Cellular Phones," Proceedings of the Custom Integrated Circuits Conference, Santa Clara (May 1-4, 1995), New York, IEEE, U.S. vol. Conf. 17, May 1, 1995, pp. 297-300, XP000536811.

Verma, Naveen et al., "An Ultra Low Energy 12-bit Rate-Resolution Scalable SAR ADC for Wireless Sensor Nodes", IEEE Journal of Solid-State Circuits, vol. 42, No. 6, Jun. 2007, pp. 1196-1205.

Fu, Z. et al., "Nano-Wat Silicon-On-Sapphire ADC Using 2C-1C Capacitor Chain", Electronics Letters, vol. 42, No. 6, Mar. 2006, 2 pages.

Ginsburg, Brian P. et al., "An Energy-Efficient Charge Recycling Approach for a SAR Converter with Capacitive DAC", Circuits and Systems, 2005, ISCAS2005, pp. 184-187.

* cited by examiner

ANALOGUE-TO-DIGITAL CONVERTER AND METHOD FOR USING THE SAME

CROSS-RELATED APPLICATIONS

The present application claims priority to U.S. Provisional Application 61/000,721, filed with the U.S. Patent and Trademark Office on Oct. 25, 2007, and European Patent Application 07119301.5, filed with the European Patent Office on Oct. 25, 2007.

FIELD

The present disclosure relates to an analogue-to-digital (A/D) converter. In particular, an analogue-to-digital conversion architecture suitable for using a low energy search method is proposed.

BACKGROUND

In a typical successive approximation register analogue-to-digital conversion (SAR ADC) architecture (as shown in FIG. 1) the input $V_{in}$ is compared against a digital-to-analogue converter (DAC) output $V_A$ using a comparator (3) in several cycles. The input can first go through a sample and hold block (2). The SAR logic (4) executes a search algorithm, typically this is a binary search. In the first cycle the input is compared against the middle of the ADC range. From the comparator output the most significant bit (MSB) can be determined. In the next cycle MSB−1 is determined. A conversion to n bits (7) requires n cycles.

The DAC (5) is typically made with a capacitive DAC. Binary weighted DACs contain capacitances with weight factor $2^i$ for the $i^{th}$ bit. The least significant bit (LSB) has a capacitance C ($=2^0*C$) and the MSB has a capacitance $2^{n-1}*C$.

In the binary search cycle with a binary weighted capacitive DAC, determining the MSB consumes most energy. The large capacitor controlling the MSB output of the DAC has to be charged to generate the reference level and subsequently discharged if the MSB is 0. With this operation, an energy $2^{n-1}*C*V^2/2$ is dissipated, and this happens for half of the input samples. Several groups have proposed different configurations which try to recover the energy of this capacitor discharge. In '*An energy-efficient charge recycling approach for a SAR converter with capacitive DAC*' (Ginsburg et al., Circuits and Systems, 2005, ISCAS2005) the MSB capacitor is split into b−1 binary scaled sub-capacitors. The average switching energy can be reduced by 37% compared to a conventional switching method. The method further uses a charge recycling approach by reconnecting capacitors instead of discharging them.

The power consumption of an ADC can be reduced by improving the operation of the comparator. A technique following this approach is presented in '*An Ultra Low Energy 12-bit Rate-Resolution Scalable SAR ADC for Wireless Sensor Nodes*' (N. Verma et al., Journal of Solid-State Circuits, vol. 42, no. 6, pp. 1196-1205, June 2007). A variety of techniques were employed for minimizing the overall power consumption. Differential binary DACs are used with a standard binary search algorithm. The focus is on the use of a low gain comparator combined with an offset compensating latch. This latch minimizes the gain requirements of the comparator preamplifiers, providing a power reduction of approximately 70% in the preamplifiers.

In '*Nano-Watt silicon-on-sapphire ADC using 2C-1C capacitor chain*' (Z. Fu et al., Electronics Letters, Vol. 42, No. 6, March 2006) an ultra-low power ADC is presented which combines a 2C-1C capacitor chain implementation and a switched capacitor with cascaded inverter. The latter is chosen as a high-speed and ultra-low power comparator. As a result, the ADC has a power consumption as low as 900 nW at 1.1V power supply and 1.35 µW at 1.5V. One problem with switched capacitor DACs is that of capacitor mismatch. When constructing switched capacitors, process variations such as layer-misalignment or etch variations can cause variations in capacitance values of different capacitors. These variations may only be a few percent of the total capacitance. However, for DACs such as a 10-bit DAC, the largest capacitor is $C*2^9$ or 512C and a 5% variation is 26C, many times larger than the smallest capacitors. To improve the matching, a DAC with a thermometer MSB sub-DAC and binary LSB sub-DAC with scrambled thermometer coding is presented in U.S. Pat. No. 6,154,162. This approach is not very profitable for the overall power consumption because the capacitors in the LSB sub-DAC are larger than the capacitors in MSB sub-DAC.

SUMMARY

The present disclosure relates to an analogue-to-digital converter for converting an input signal to a digital code representing the input signal. The converter comprises a comparator for comparing the input signal with a reference signal and producing a comparator output signal, a search logic block arranged for being fed with the comparator output signal and for determining the digital code based on the comparator output signal and a digital-to-analogue converter arranged for receiving input from the search logic block and for generating the reference signal to be applied to the comparator. For generating the reference signal the digital-to-analogue converter at least comprises a first portion implemented with equal capacitors. Preferably the capacitors are at least as big as the other (non-equal) capacitors in the D/A converter. The first portion with equal capacitors is so positioned that the reference signal can be used for deriving at least the most significant bit of the digital code. In a preferred embodiment the first portion is implemented with at least three equal capacitors. Compared to e.g. a digital-to-analogue converter implemented with binary weighted capacitors, a smaller capacitor needs to be charged and therefore the energy-consuming action of charging/discharging large capacitors is avoided.

In an embodiment, the analogue-to-digital converter further comprises a second portion implemented with binary weighted capacitors. To speed up the conversion algorithm, a digital-to-analogue converter as described herein can be combined with a second portion comprising binary weighted capacitors.

In an embodiment, the first portion of the analogue-to-digital converter is arranged for being controlled by a thermometer coded signal. A full thermometer algorithm or slope search is the most efficient search algorithm, as it avoids the discharge of capacitors and hereby does not waste energy.

In an embodiment, the second portion of the analogue-to-digital converter is arranged for being controlled by a thermometer coded signal. In another embodiment, the second portion can also be controlled by a binary coded signal. The converter avoids charging-discharging of large capacitors during the search and therefore reducing the lost energy. The idea is to discharge only limited amounts of capacitors. For example: for a 6-bit ADC whereby the first two bits are determined via the first portion in combination with a thermometer coded signal and the four remaining bits are determined via the second portion in combination with a binary coded signal. Typically the algorithm starts at half of the range. If the system needs to go to a quarter of the range then only one 16C needs to be discharged, consuming 16 C V². An ADC with a binary DAC would discharge one 32C capacitor and charge one 16C capacitor, hereby consuming 48 C V². In an embodiment of the converter, the most significant bits are determined by using equal capacitors controlled by a thermometer code. The power consumption is improved by avoiding big capacitors to discharge.

In an embodiment, the analogue-to-digital converter comprises a plurality of these digital-to-analogue converters. The different DACs can be coupled by an analogue addition circuit. In the case of high bit counts, binary DACs are split up in two or more capacitive sub-DACs coupled by an addition circuit. This is done to avoid too large differences in sizes and consequent risks for mismatch. The addition circuit can be a simple coupling attenuating attenuator or a weighted summing amplifier.

In another aspect, a method is described for converting an input signal to a digital code with an analogue-to-digital converter as previously described. The method comprises a step of determining the most significant bit by comparing the input signal with a signal charged on a capacitor of said first portion of the analogue-to-digital converter.

BRIEF DESCRIPTION OF THE DRAWINGS

The invention is further elucidated by means of the following description and the appended figures.

DETAILED DESCRIPTION

Figure 1:
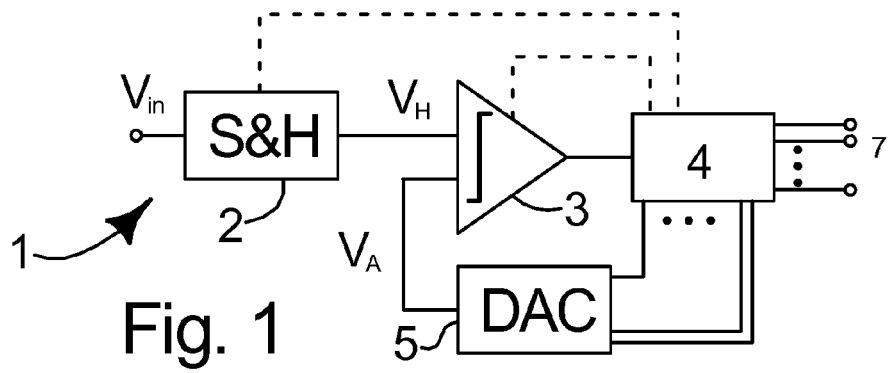
FIG. 1 represents a classical SAR architecture.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

The term "comprising", used in the claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B.

The analogue-to-digital conversion (ADC) systems described herein endeavour to avoid charging/discharging large capacitors and as a consequence decrease the energy loss. An ADC comprises a DAC which is classically implemented with binary weighted capacitors, using a binary search algorithm to derive the digital representation of an analogue input signal. A binary search algorithm sequentially charges the binary scaled DAC capacitors for every code. For a 6-bit DAC this means that all 6 capacitors are charged (and some discharged) during the SAR search cycle. With discharging a capacitor, power is wasted. With a thermometer DAC (in which all capacitors are equal) a binary search algorithm results in much less wasted power through capacitor discharges, because part of the capacitors can remain charged when moving to a lower signal level. A further power improvement changes the search algorithm. The extreme case of this is a slope search (full thermometer/counting algorithm). With this algorithm no energy is wasted, but it is very slow (to find code 63, sixty-four clock-pulses are required) and the thermometer DAC is large (64 capacitors). The proposed algorithm uses a combination of a binary and a slope search, in which a slope search is used for the thermometer coded MSB DAC bits, or a part thereof, and a binary search is used for the lower bits. With a slope search algorithm only one Thermo-MSB capacitor is discharged.

Figure 2:
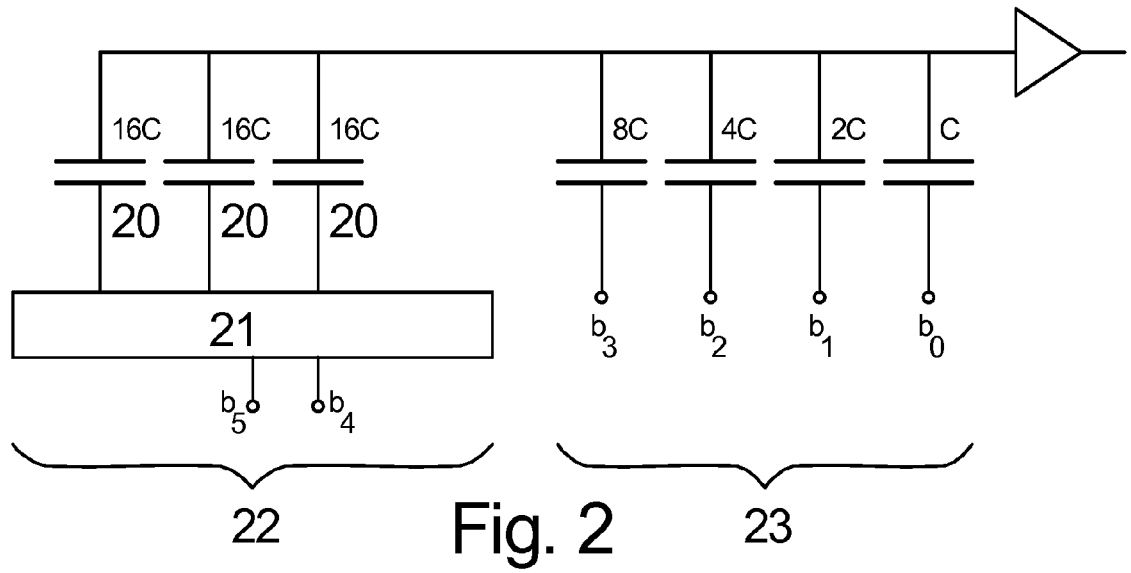
FIG. 2 represents a proposed architecture of the DAC as used in an SAR ADC as described herein.

A possible implementation splits the top capacitor in two capacitors with half of the value ($2*2^{n-1}*C$). When moving from half of the DAC range to a quarter (which happens when the MSB is 0), only one capacitor is discharged and no extra energy is required to generate the next reference level at ¼ of the DAC range. This principle can be extended to the lower bits. It then converges to a "thermometer" DAC for the m most significant bits. FIG. 2 shows an example of a 6 bit DAC with a thermometer code (22) for the first 2 bits and a binary weighted DAC (23) for the remaining 4 bits. The thermometer code DAC (22) comprises 3 equal capacitors (20) with value 16C and a binary-thermometer decoder (21). In combination with a binary search algorithm this results in lower overall power, because less capacitors are discharged during the SAR iteration cycles. Note that for the LSB a thermometer DAC can also be used because of the guaranteed monotonicity of a thermometer DAC.

With such DAC the search algorithm can be optimized for low energy consumption rather than for speed (or low amount of iteration cycles). This means that extra conversion cycles are used to obtain lower energy consumption. A generic search algorithm can work as follows:

For the m most significant bits (which have to be connected to the thermometer portion of the DAC) scan through the $2^m$ bit codes, starting with 0 (or 0001) and incrementing by 1 on every iteration cycle. This is similar to a slope converter. When the comparator toggles, the conversion cycle is stopped, and the values of the m most significant bits are known. This is called the slope search cycle.

For the n−m remaining bits a binary search algorithm is used.

Figure 3:
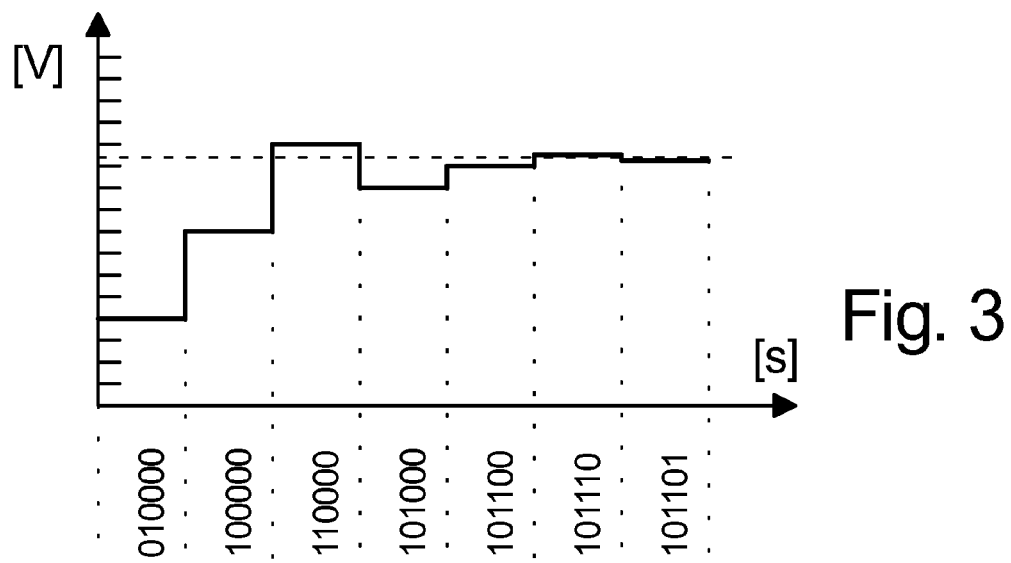
FIG. 3 graphically represents a proposed search algorithm.

FIG. 3 shows the search algorithm for a 6 bits ADC of which the 2 MSBs use a slope search (n=6, m=2). The 2 MSBs are determined using a slope converter technique (30). In maximum 4 cycles (and if the input is always within the input range, even in 3), the MSBs are determined. In the example given in the figure, it takes 3 cycles to find the 2 MSBs (in this case '10'). Then a binary search (31) is executed for the 4 LSBs which takes 4 cycles. Note that m (=# bits used in slope search cycle) does not necessarily correspond to the amount of bits connected to the thermometer DAC. The m bits should be connected to a thermometer DAC to make the conversion energy efficient, but some of the n−m bits may also be connected to a thermometer DAC to save energy. Surely, a thermometer DAC also offers power savings for a binary search cycle, as said before.

The optimum value for m comes from the trade off between the power savings in the DAC and the extra required power in the comparator and SAR logic for the extra conversion cycles. Whilst a binary search requires n conversion cycles, the proposed algorithm requires maximum $2^m+(n-m)$ cycles. The energy dissipated to generate the DAC levels for m most significant bits is $2^{(n-m)}*C*V^2$, since only one capacitor needs to be discharged (namely when the DAC output was higher than the signal input).

In addition to energy being dissipated, there is also energy stored on the capacitors to generate the reference level. That cannot be avoided. This energy is lost only at the end of the conversion cycle (once per conversion). A single slope converter combined to a thermometer DAC consumes the lowest energy in the DAC and the energy in the DAC would be directly proportional to the input signal. With DN the digital input value of the input signal $V_{in}$ and C the unit capacitance of the thermometer DAC, the slope converter would have consumed $DN*C*V^2/2$ to generate the reference level on the DAC at the end of the AD conversion. This is theoretically the minimal energy required in the DAC. However, because of the large amount of iteration cycles and the power consumed in the comparator, clocking and logic, the total energy consumed can be larger than the proposed approach.

In the case of high bit counts, binary DACs are split up in 2 or more capacitive sub-DACs coupled by a coupling capacitor or (weighted) summation circuit. This is done to avoid too large differences in sizes and consequent risks for mismatch.

Figure 4:
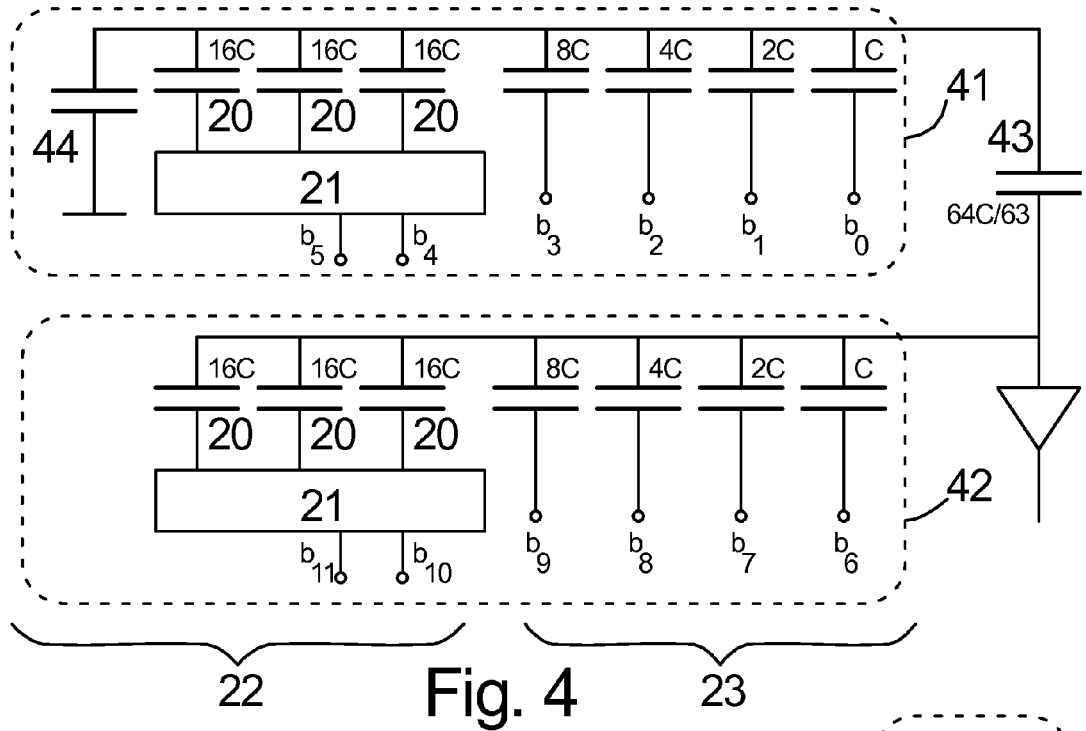
FIG. 4 represents a split capacitor DAC architecture.

FIG. 4 shows an example with 2 sub-DACs (41, 42). The two sub-DACs have an identical circuit and are coupled with an attenuation capacitor (43). This also means that the highest significant bit in each sub-DAC consumes an equal amount of power. In a classical configuration with sub-DACs, for example in a 12-bit DAC with 2×6 bit sub-DACs, an equal power is consumed for the $5^{th}$ and $11^{th}$ (MSB) bit. This means the principles explained in the previous paragraph for the most significant bits of each sub-DAC are applied separately. The most significant bits of each sub-DAC are generated with a thermometer DAC and the search algorithm switches to slope search mode for the most significant bits of each sub-DAC.

Figure 5:
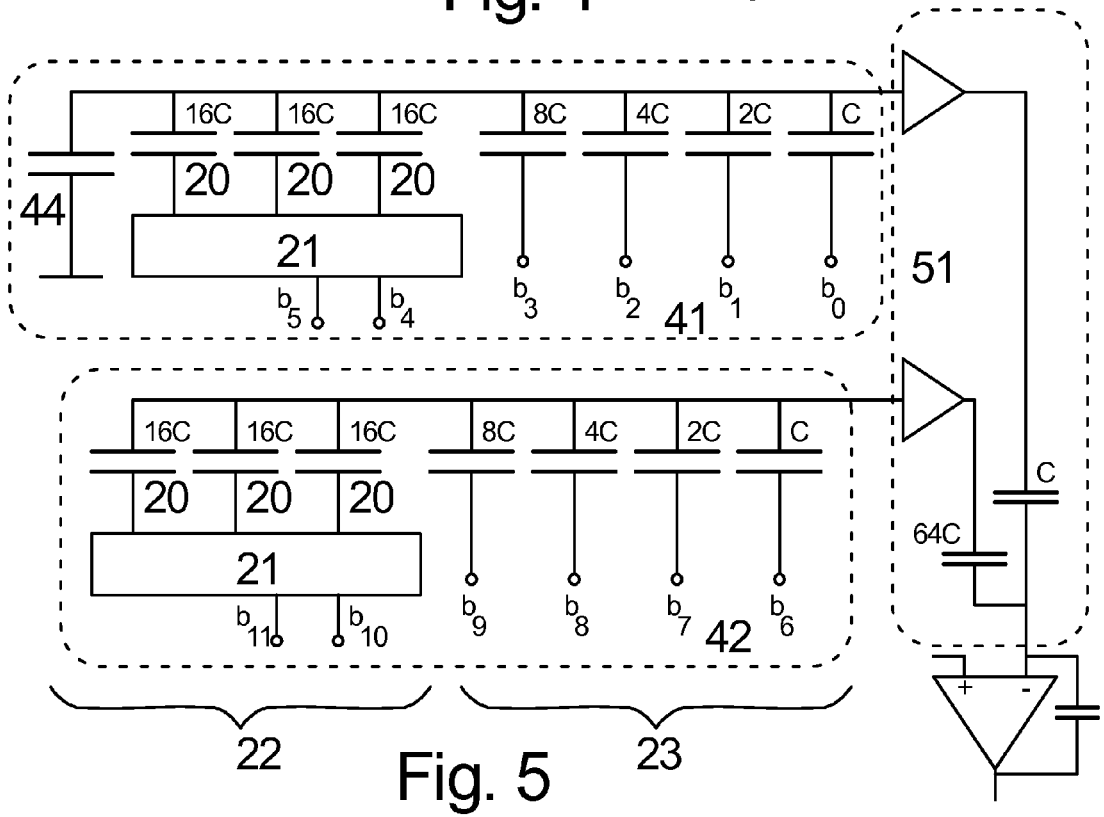
FIG. 5 represents a split capacitor DAC architecture comprising a weighted summation amplifier.

FIG. 5 shows a configuration in which the signals of the 2 sub-DACs are summed with a weighted summing amplifier (51). In each case, using a thermometer code and slope search for the most significant bits of each sub-DAC reduces the power consumption of the entire DAC.

In an alternative embodiment another algorithm is introduced. Instead of charging 1 MSB-thermometer capacitor, all LSB-capacitors are charged. (Binary search is possible, but to save clocks, they should be charged all at once.) If the comparator does not switch, one MSB-thermometer capacitor is added at every next clock. (In this example a [2, 4] segmentation is used.). The advantage of this approach is that the biggest capacitor of the binary coded part is already charged when the search for the binary coded part starts. Only the smaller bits need to be discharged. When the comparator switches, instead of discharging a thermo (big) capacitor, the smallest LSBs (b0, b1, b2) are discharged and a binary search for bits b4, b3, b2, b1 is started. Therefore (with a single DAC) the thermometer-capacitors are not discharged and the largest LSB is only discharged when it is required. On average with this algorithm less energy from the capacitors is discharged but it does cost 1 extra clock.

The invention claimed is:

1. An analogue-to-digital converter for converting an input signal to a digital code representing said input signal comprising:
 a comparator arranged for comparing the input signal with a reference signal and for producing a comparator output signal;
 a search logic block arranged for being fed with the comparator output signal and for determining said digital code; and
 a digital-to-analogue converter arranged for receiving input from the search logic block and for generating said reference signal to be applied to said comparator;
 wherein the digital-to-analog converter comprises, for generating the reference signal, at least a first portion implemented with equal capacitors and so positioned that the reference signal can be used for deriving at least the most significant bit of the digital code.

2. The analogue-to-digital converter as in claim 1, wherein the first portion is implemented with at least three equal capacitors.

3. The analogue-to-digital converter as in claim 1, further comprising a second portion implemented with binary weighted capacitors.

4. The analogue-to-digital converter as in claim 1, wherein the first portion is arranged for being controlled by a thermometer coded signal.

5. The analogue-to-digital converter as in claim 3, wherein the second portion is arranged for being controlled by a thermometer coded signal.

6. The analogue-to-digital converter as in claim 3, wherein the second portion is arranged for being controlled by a binary coded signal.

7. The analogue-to-digital converter as in claim 1 comprising a plurality of the digital-to-analogue converters.

8. The analogue-to-digital converter as in claim 7 wherein the plurality of digital-to-analogue converters is coupled by an analogue addition circuit.

9. The analogue-to-digital converter as in claim 7 wherein the plurality of digital-to-analogue converters is summed by a weighted summing amplifier.

* * * * *